(12) United States Patent
Rajavel et al.

(10) Patent No.: US 7,368,765 B1
(45) Date of Patent: May 6, 2008

(54) BIPOLAR TRANSISTORS WITH LOW PARASITIC LOSSES

(75) Inventors: Rajesh D. Rajavel, Oak Park, CA (US); David H. Chow, Newbury Park, CA (US); Tahir Hussain, Calabasas, CA (US); Yakov Royter, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 23 days.

(21) Appl. No.: 11/313,862

(22) Filed: Dec. 20, 2005

(51) Int. Cl.
*H01L 29/739* (2006.01)
*H01L 31/00* (2006.01)
(52) U.S. Cl. .................... 257/198; 257/197
(58) Field of Classification Search ............. 257/197, 257/198
See application file for complete search history.

(56) References Cited

U.S. PATENT DOCUMENTS

| 5,506,427 | A | * | 4/1996 | Imai ............................ 257/197 |
| 6,320,211 | B1 | * | 11/2001 | Morishita .................... 257/197 |
| 6,911,716 | B2 | | 6/2005 | Chen et al. |
| 2002/0089038 | A1 | * | 7/2002 | Ning ........................... 257/574 |
| 2004/0046182 | A1 | * | 3/2004 | Chen et al. ................. 257/197 |

* cited by examiner

*Primary Examiner*—Jerome Jackson
*Assistant Examiner*—Anthony Ho
(74) *Attorney, Agent, or Firm*—Christie, Parker & Hale

(57) ABSTRACT

Bipolar junction transistors (BJTs) and single or double heterojunction bipolar transistors with low parasitics, and methods for making the same is presented. A transistor is fabricated such that the collector region underneath a base contact area is deactivated. This results in a drastic reduction of the base-collector parasitic capacitance, $C_{bc}$. An embodiment of the present invention provides a transistor architecture for which the base contact area can be decoupled from the collector and hence allows for dramatic reduction in the parasitics of transistors.

33 Claims, 17 Drawing Sheets

BIPOLAR TRANSISTORS WITH LOW PARASITIC LOSSES

FIELD OF THE INVENTION

The invention relates generally to bipolar junction transistors (BJTs) and methods for making the same. More particularly, the invention relates to bipolar transistors with low parasitic losses and methods for making the same.

BACKGROUND OF THE INVENTION

Typically, a BJT consists of a vertical stack of npn or pnp semiconductor materials. A BJT can take the form of a double heterojunction bipolar transistor (DHBT), as compared to a homojunction BJT. High speed operation is achieved through judicious scaling down of the thickness of the vertical stack of semiconductors and scaling down of the lateral dimensions of the size and spacing of the contacts. The electron transit time decreases though device scaling of the vertical and lateral dimensions. Also, the parasitics associated with capacitance increases as the vertical dimensions are reduced. For example, thinning the base and collector layers reduces the carrier transit times but increases the base resistance and base collector capacitance. The base collector capacitance can be reduced through lithographically scaling the base, collector, and emitter regions. However, the parasitics associated with the contact resistance increase as the lateral dimensions are reduced, since resistance is proportional to the contact area.

Vertical scaling of the epitaxial structure and lithographic lateral scaling are the traditional approaches used to improve transistor performance. A cross-sectional view of a conventional Indium Phosphide based DHBT (InP-based DHBT) that utilizes the triple mesa architecture is illustrated in FIG. 1, which depicts the prior art. Here, emitter contact 10, base contacts 20, and collector contact 30 all lie at different vertical positions. There is a base-collector capacitance, $C_{bc}$, which includes the base collector capacitance from the intrinsic base (base region located adjacent the emitter in the vertical direction) and the extrinsic base (the base region which extends laterally from the intrinsic base region. The extrinsic base includes the region to which external base contacts 20 are made). As the extrinsic base area is reduced, the capacitance $C_{bc}$ decreases, but the base contact resistance increases. As such, the conventional mesa structure is not optimal for parasitics reduction due to the following disadvantage: Independent optimization of the extrinsic base contact area and the capacitance $C_{bc}$ is not possible. Hence there is significant base-collector capacitance which arises from the collector region that lies under the base contact. Additionally, the base contact area cannot be increased without incurring a capacitance $C_{bc}$ penalty.

In view of the forgoing, the above described traditional BJTs have a base contact area that is coupled to a parasitic base-collector capacitance $C_{bc}$, thereby frustrating device scaling. As such, there is a continuing need to reduce the parasitic capacitance and the base resistance of BJTs, thereby enabling operation of the BJTs at higher speed. The present invention addresses this continuing need as well.

SUMMARY OF THE INVENTION

The invention relates to bipolar junction transistors (BJTs) and single or double heterojunction bipolar transistors, and methods for making the same. The invention provides a transistor embodiment that is fabricated such that the collector region underneath a base contact area is deactivated. This results in a drastic reduction of the base-collector parasitic capacitance, $C_{bc}$. Moreover, a BJT layout of the present invention offers the capability to vary base-collector breakdown voltage, $BV_{ceo}$, for transistors fabricated in the same wafer (e.g., by changing the location of the selectively doped sub-collector region). This offers the ability to optimize transistors located in the same wafer for speed and breakdown voltage.

One exemplary embodiment of the present invention provides a bipolar transistor that has an extrinsic base and a collector. The embodiment reduces a parasitic base-collector capacitance of the bipolar transistor by deactivating the collector region that overlaps the extrinsic base.

Deactivation of a part of the collector is performed by selective type-converting the collector region that is adjacent the extrinsic base of the bipolar transistor. The type-converted collector region can be included as part of the extrinsic base. The extrinsic base can extend partially into a type converted buffer layer or a substrate or both substrate and buffer layer that is located adjacent the type converted collector region. In addition, a reduction in both a parasitic base contact resistance and a base access resistance is also achieved through the use of selective doping for fabricating large and deep extrinsic base contact regions.

The extrinsic base can be doped heavier than an intrinsic base of the bipolar transistor, and an area of the extrinsic base can be increased without incurring a base-collector capacitance penalty.

Alternatively, the collector region adjacent to the extrinsic base can be rendered inactive, by depleting the charge in the collector, due to the opposite and heavier doping in the base.

In a conventional transistor, the sub-collector extends under the entire collector, as shown in FIG. 1. In the present invention, the sub-collector is located laterally from the emitter and extrinsic base. A sub-collector of the bipolar transistor can be formed using a selective doping technique by masking regions that are not doped. The selective doping technique can include an ion implantation technique, a dopant diffusion technique or a damage assisted dopant diffusion technique. A damage of the damage assisted dopant diffusion technique can be caused by ion-implantation.

The extrinsic base can be formed using a selective doping technique. The selective doping technique can include an ion implantation technique, a dopant diffusion technique, or a damage assisted dopant diffusion technique. A damage for the damage assisted dopant diffusion technique can be caused by ion-implantation.

A breakdown voltage ($BV_{ceo}$) of the bipolar transistor can be varied by selectively placing the sub-collector at a pre-determined distance away from the intrinsic base by a lithographically defined mask and the selective doping of the sub-collector. The bipolar transistor can also include suitable passivation scheme to shield the collector from electrical discharges.

The collector, the intrinsic base, the extrinsic base, and/or the emitter of the bipolar transistor can be formed using elements from III-V, II-VI or IV-IV groups of the periodic table. Examples include InP, InGaAs, InAlAs.

One exemplary embodiment of the present invention provides a bipolar transistor for reducing a parasitic base-collector capacitance. The bipolar transistor includes a collector, an extrinsic base, an intrinsic base, and an emitter. The collector is adjacent to a substrate. In the present exemplary embodiment, the parasitic base-collector capacitance $C_{bc}$ is reduced by deactivating a part of the collector that overlaps the extrinsic base.

One exemplary embodiment of the present invention provides a bipolar transistor that includes: a plurality of semiconductor layers having a collector layer, a base layer in contact with the collector layer, and an emitter layer in contact with the base layer, the base layer having the opposite doping type of the collector layer and the emitter layer, wherein the plurality of semiconductor layers are formed to include: an intrinsic base region adjacent to and in contact with the emitter layer and an extrinsic base region, the extrinsic base region being adapted to make contact with a base electrode and extending laterally from the intrinsic base region; and a sub-collector region connected to a main collector region, located laterally from the main collector region, and adapted to make contact with a collector electrode, the sub-collector region being doped heavier than the collector layer, and wherein a region of the collector layer adjacent to the extrinsic base region is selectively type converted to have the same doping type as the base layer.

Also, in one embodiment, the plurality of semiconductor layers further include a support layer in contact with the collector layer, a region of the support layer adjacent to the type converted region of the collector layer is also selectively doped with the same doping type as the base layer, and the support layer can include a buffer layer.

In one embodiment, the type converted region of the collector layer and the selectively doped region of the support layer become a part of the extrinsic base region.

In one embodiment, the type converted region of the collector layer becomes a part of the extrinsic base region.

In one embodiment, the sub-collector region is formed by selectively doping a portion of the collector layer, and the sub-collector region is substantially located laterally from the intrinsic base region.

In one embodiment, the plurality of semiconductor layers further include a support layer in contact with the collector layer, the sub-collector region is formed by selectively doping a portion of the collector layer and a portion of the support layer, the sub-collector region is substantially located laterally from the intrinsic base region, and the support layer can include a buffer layer.

In one embodiment, the bipolar transistor further includes an emitter formed by the emitter layer, wherein the proximity of the sub-collector region to the emitter can be altered to vary with the collector break-down voltage.

In one embodiment, the bipolar transistor further includes an emitter formed by the emitter layer, wherein a lateral region of the collector layer between the base region and the sub-collector region is passivated to improve breakdown characteristics.

In one embodiment, a heterojunction is formed between the emitter layer and the base layer.

In one embodiment, a first heterojunction is formed between the emitter layer and the base layer and a second heterojunction is formed between the base layer and the collector layer.

In one embodiment, the base electrode contacting the extrinsic base region can be increased in area without significantly increasing the base-collector capacitance.

In one embodiment, the extrinsic base region is selectively doped heavier than the intrinsic base region.

In one embodiment, each of the collector layer, the base layer, and the emitter layer is substantially made from a compound having two or more elements selected from the group consisting of boron (B), aluminum (Al), gallium (Ga), indium (In), nitrogen (N), phosphorus (P), arsenic (As), antimony (Sb) and bismuth (Bi).

In one embodiment, each of the collector layer, the base layer, and the emitter layer is substantially made from a material having one or more elements selected from the group consisting of carbon (C), silicon (Si), and germanium (Ge).

In one embodiment, each of the collector layer, the base layer, and the emitter layer is substantially made from a compound having two or more elements selected from the group consisting of beryllium (Be), magnesium (Mg), zinc (Zn), cadmium (Cd), mercury (Hg), manganese (Mn), oxygen (O), sulfur (S), selenium (Se), and tellurium (Te).

In one embodiment, each of the extrinsic base region and the sub-collector region is formed by a masking method and an implant method.

In one embodiment, each of the extrinsic base region and the sub-collector region is formed by a masking method and a diffusion method.

In one embodiment, each of the extrinsic base region and the sub-collector region is formed by a masking method and an implant and diffusion method, the implant and diffusion method includes an implant method followed by a diffusion method, and the implant method provides damages for enhancing diffusion in a vertical direction.

In one embodiment, the plurality of semiconductor layers are formed to become a planar transistor adapted to improve heat dissipation.

In one embodiment, the plurality of semiconductor layers are formed to become an active component in an integrated circuit.

In one embodiment, the emitter layer substantially includes InP or InAlAs, the base layer substantially includes InGaAs or GaAsSb, and the collector layer substantially includes InGaAs or InP.

In one embodiment, the sub-collector region is implanted with silicon (Si).

In one embodiment, the extrinsic base region is doped with zinc (Zn), beryllium (Be), or both Zn and Be.

In one embodiment, the sub-collector region is implanted with silicon (Si), and the extrinsic base region is doped with zinc (Zn) and beryllium (Be).

In one embodiment, the extrinsic base region and the sub-collector region are formed with the emitter layer intact.

In one embodiment, the extrinsic base region and the sub-collector region are formed by etching away a part of the emitter layer.

In one embodiment, the sub-collector region is formed with the base layer intact.

In one embodiment, the sub-collector region is formed by etching away a part of the base layer.

In one embodiment, an emitter is formed by the emitter layer. The emitter has a substantially circular shape or a substantially square shape and is surrounded in part by portions of the sub-collector region and in part by portions of the extrinsic base region. The portions of the sub-collector region and the portions of extrinsic base region are alternatively arranged around the emitter.

In one embodiment, an emitter is formed by the emitter layer. The emitter has a dimension (e.g., a diameter or a side) that is less than 150 nm.

In one embodiment, the emitter layer, the base layer, and the collector layer can be graded in composition and can include multiple layers of materials.

A more complete understanding of the bipolar transistors with low parasitic losses and the methods for making the same will be afforded to those skilled in the art, as well as a realization of additional advantages and objects thereof, by a consideration of the following detailed description. Reference will be made to the appended sheets of drawings which will first be described briefly.

BRIEF DESCRIPTION OF THE DRAWINGS

The accompanying drawings, together with the specification, illustrate exemplary embodiments of the present invention, and, together with the description, serve to explain the principles of the present invention, wherein.

DETAILED DESCRIPTION

The invention is described below, with reference to detailed illustrative embodiments. It will be apparent that the invention can be embodied in a wide variety of forms, some of which may be quite different from those of the disclosed embodiments. Consequently, the specific structural and functional details disclosed herein are merely representative and do not limit the scope of the invention.

The invention relates to bipolar junction transistors (BJTs) and heterojunction bipolar transistors (HBTs) and methods for making the same. HBTs with architectures that enable the independent optimization of extrinsic base resistance and base-collector capacitance $C_{bc}$ are highly desirable. An embodiment of the present invention provides a transistor architecture for which the base contact area can be decoupled from the collector and hence allows for dramatic reduction in the parasitics of transistors. A transistor in one embodiment of the present invention uses a selectively doped sub-collector and base contact regions, and can be fabricated such that there is no active collector region underneath the base contact area as shown in FIG. 2C. This device offers several advantages over conventional InP-based bipolar transistors, such as:

1) The deactivation of collector region adjacent the extrinsic base through selective doping of the extrinsic base and type conversion of the collector results in a drastic reduction in the base-collector capacitance $C_{bc}$. The base contact area is therefore decoupled from the active collector region.

2) Lower extrinsic base contact resistance $R_{bex}$ is achieved because of three favorable factors:
   i) reduction of the base contact resistance through higher doping in the extrinsic base;
   ii) use of larger base metal contact area without incurring a base-collector capacitance penalty, and
   iii) the thick extrinsic base contact region results in reduced base access resistance.

3) The ability to vary base-collector breakdown voltage $BV_{ceo}$ in transistors in the same chip by changing the location of the selectively doped sub-collector. This permits optimization of the transistors for speed and breakdown voltage within a circuit. Thicker collectors are realized by lithographically spacing the sub-collector implant area further from the intrinsic base in a lateral direction.

Figure 1:
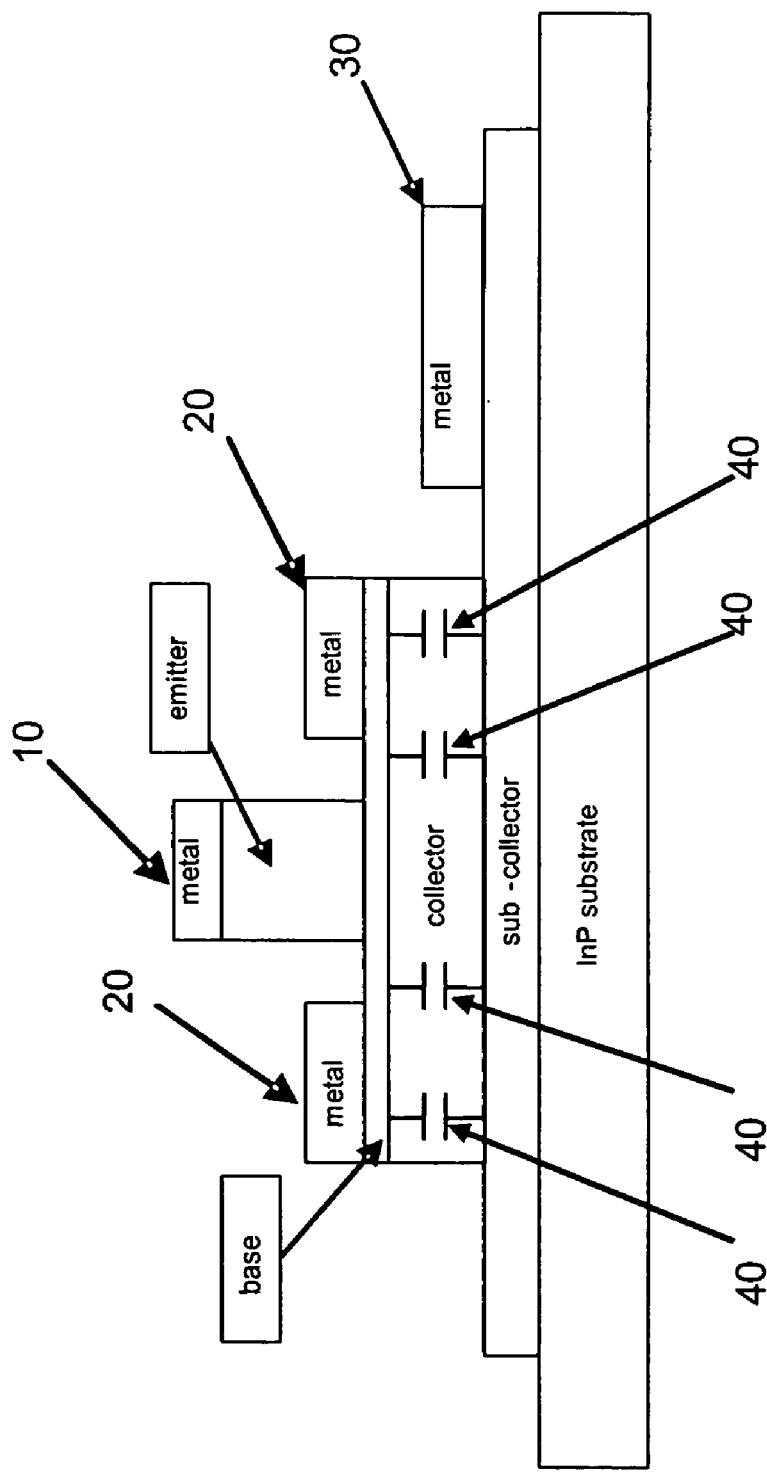
FIG. 1 is a schematic diagram of a traditional InP-based DHBT.
Figure 2A:
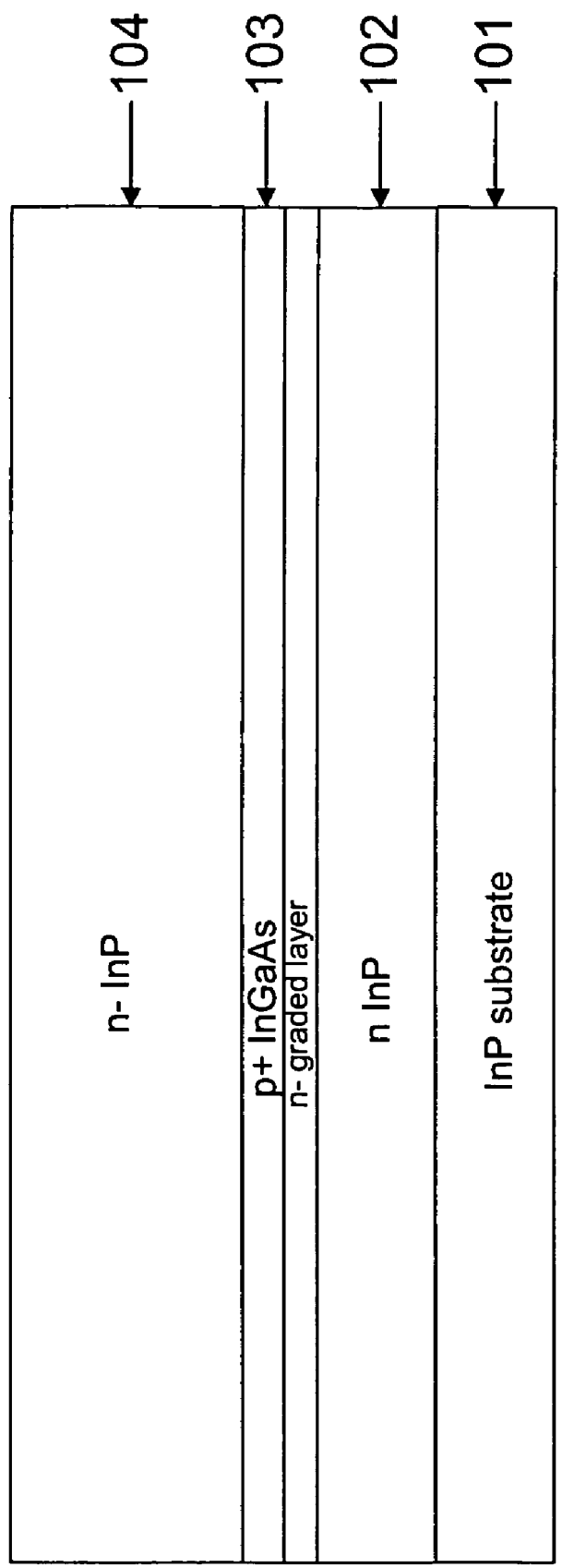
FIGS. 2A, 2B, and 2C are schematic diagrams illustrating a process flow for fabricating a BJT according to an embodiment of the present invention.
Figure 2B:
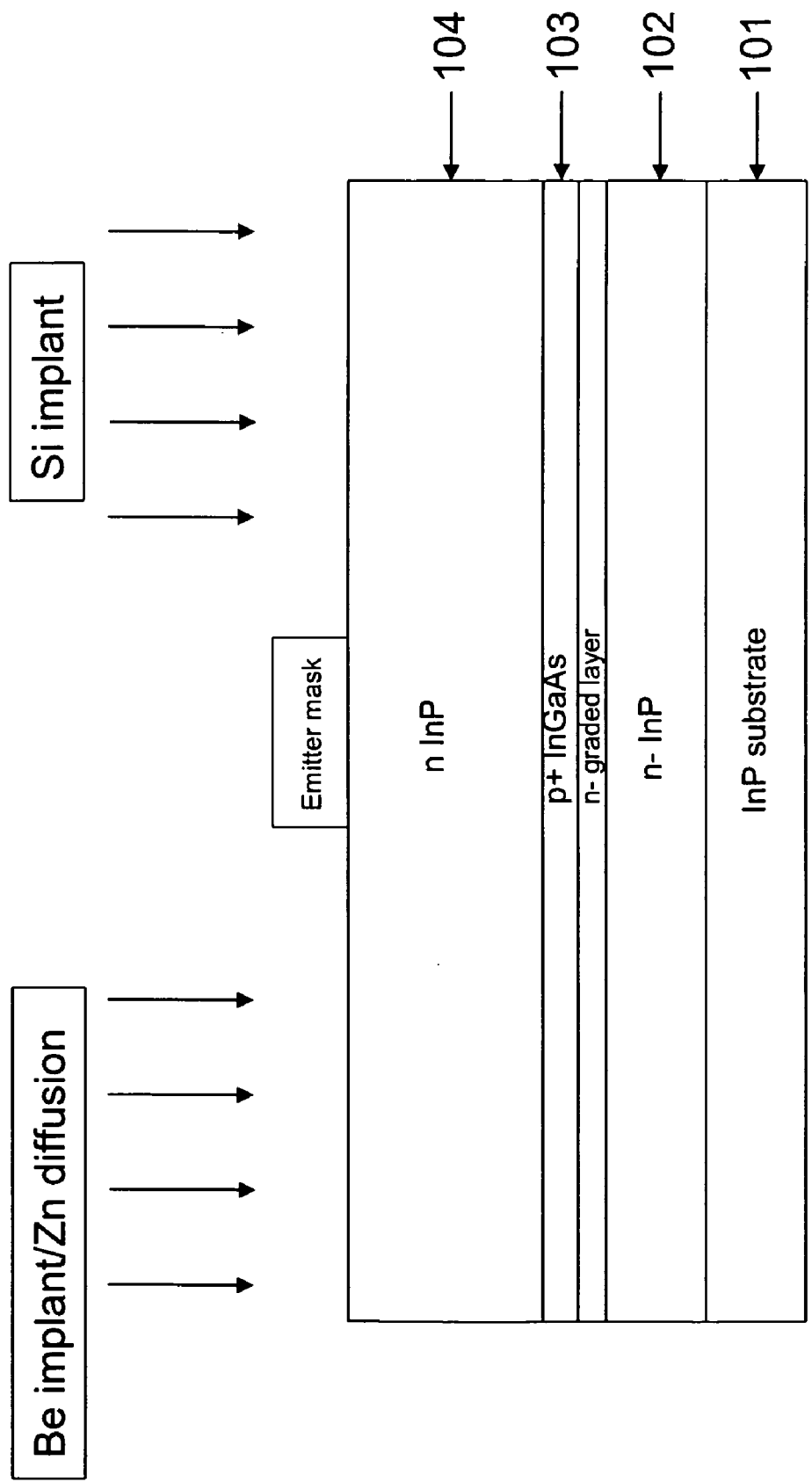
Figure 2C:
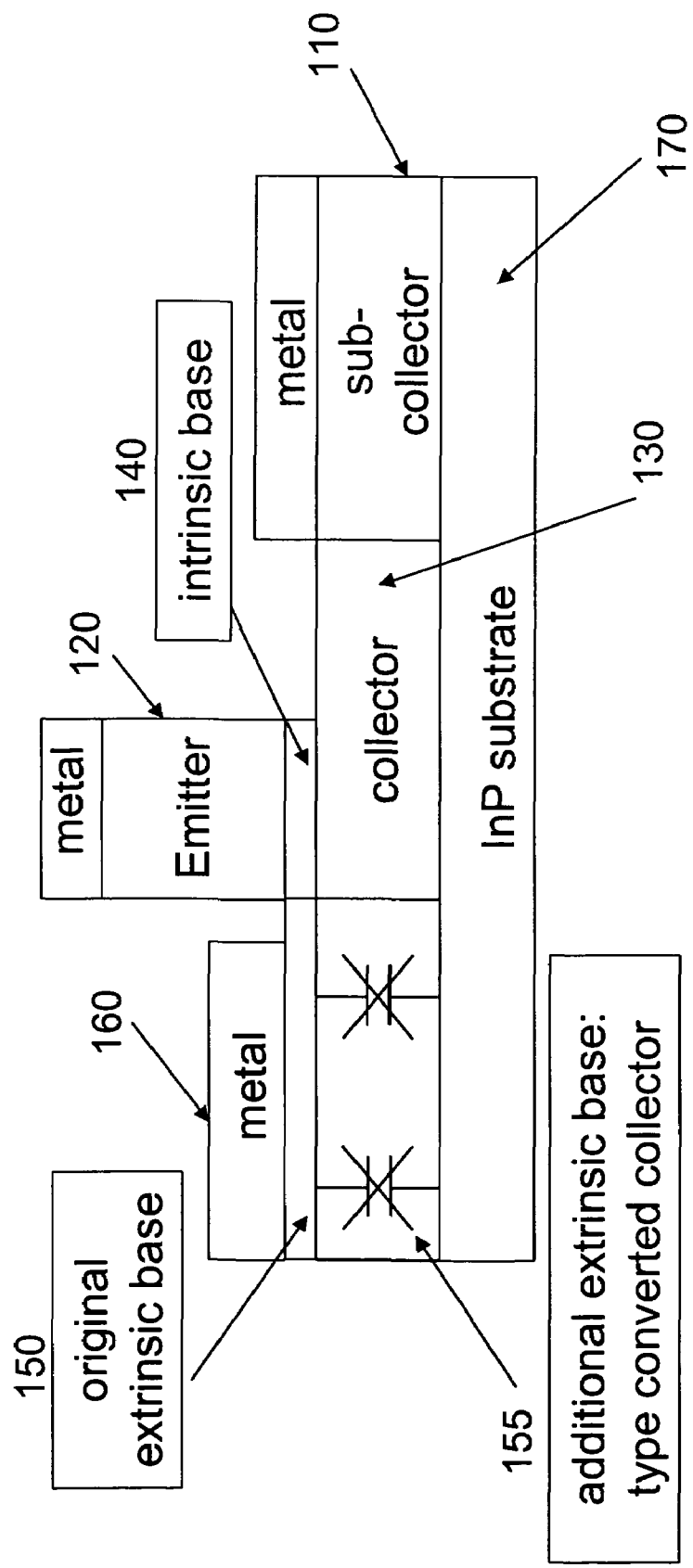

Referring to FIGS. 2A, 2B, and 2C, a dramatic reduction of base-collector capacitance $C_{bc}$ is achieved by a transistor architecture wherein the type converted collector region 155 under the extrinsic base does not contribute significantly to the base-collector capacitance $C_{bc}$. As shown in FIG. 2B, beryllium (Be) implantation and/or zinc (Zn) diffusion is employed for the type conversion and deactivation of a portion of the collector (n− InP) layer (or material) 102 under base layer (p+ InGaAs) 103. The type converted collector 155 becomes a part of the extrinsic base which includes the original extrinsic base region 150. This results in a thick extrinsic base (which includes 150 and 155) which has reduced extrinsic base resistance $R_{bex}$, and the freedom to utilize large base contacts 160 without incurring a base-collector capacitance penalty. Sub-collector 110 is located adjacent to the collector 130, in a lateral direction (as opposed to the triple mesa structure which has a vertical orientation) and is formed by silicon (Si) implantation, as shown in FIG. 2B, for producing n+ InP.

As formed, the DHBT of FIG. 2C is more planar as compared to the standard triple mesa structure, due to the lateral positioning of sub-collector 110. Since the collector is in direct physical contact with substrate 170, the DHBT of FIG. 2C should have improved local heat dissipation characteristics, which is an important attribute for transistors operating at high current densities.

In addition, a buffer layer can be included as being part of support layer 101 which also includes substrate 170. That is, some device structures use a buffer layer (not shown) grown atop a substrate (e.g., substrate 170) before the growth of collector, base, and emitter layers. However, the present invention is not thereby limited and various modifications appreciated by those skilled in the art may be made.

Furthermore, referring to the FIGS. 2A and 2B, an InGaAlAs graded quaternary layer can also be included with collector layer 102 to facilitate an unimpeded carrier flow. The InGaAlAs graded quaternary layer is adjacent to base layer 103.

The emitter, base, and collector regions can be graded in composition, and can include multiple materials and layers (not shown).

In more detail, FIGS. 2A, 2B, and 2C illustrate a process flow for fabricating a DHBT according to an embodiment of the present invention. FIG. 2A shows epitaxial structures prior to implantation. The epitaxial structures include a sequence of semiconductor layers having support layer 101, which can include a buffer layer, collector layer 102, base layer 103 in contact with collector layer 102, and emitter layer 104 in contact with base layer 103. FIG. 2B shows the structures undergoing the sub-collector and extrinsic base implants. FIG. 2C shows the BJT in which the region 155 under extrinsic base 150 does not contribute to base-collector capacitance $C_{bc}$ due to the selective type conversion of region 155 into a portion of extrinsic base.

Figure 3A:
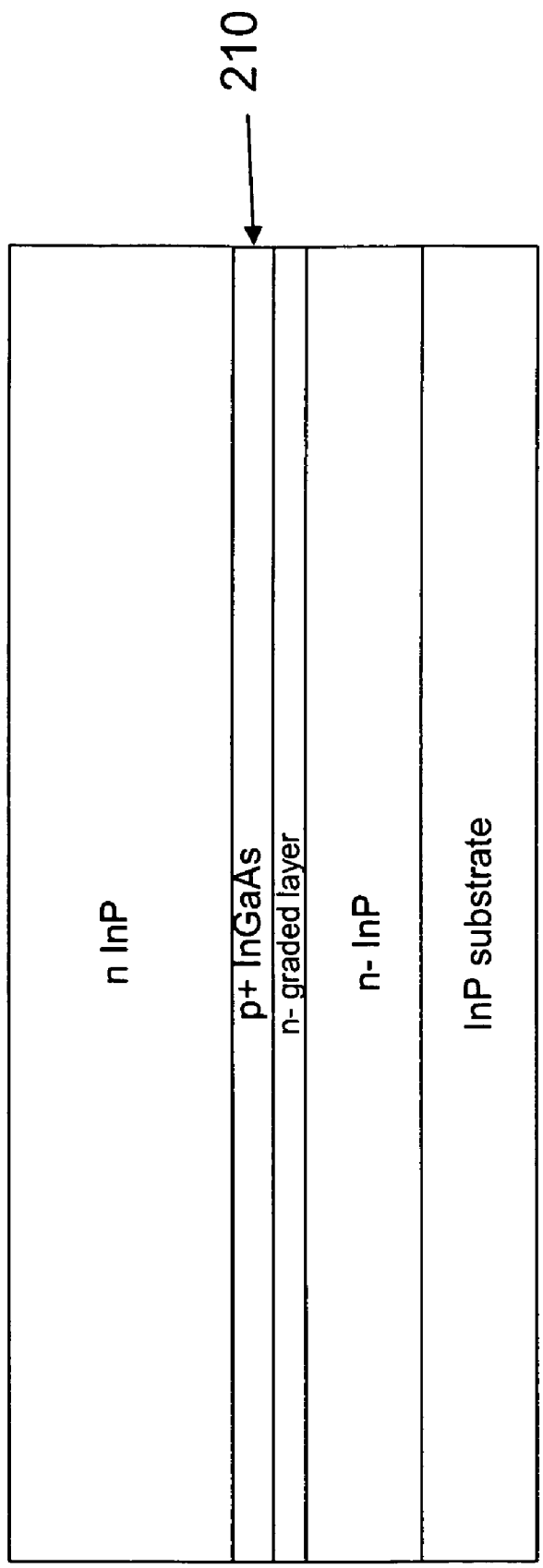
FIGS. 3A, 3B, and 3C are schematic diagrams illustrating a process flow for fabricating a BJT according to an alternative embodiment of the present invention.
Figure 3B:
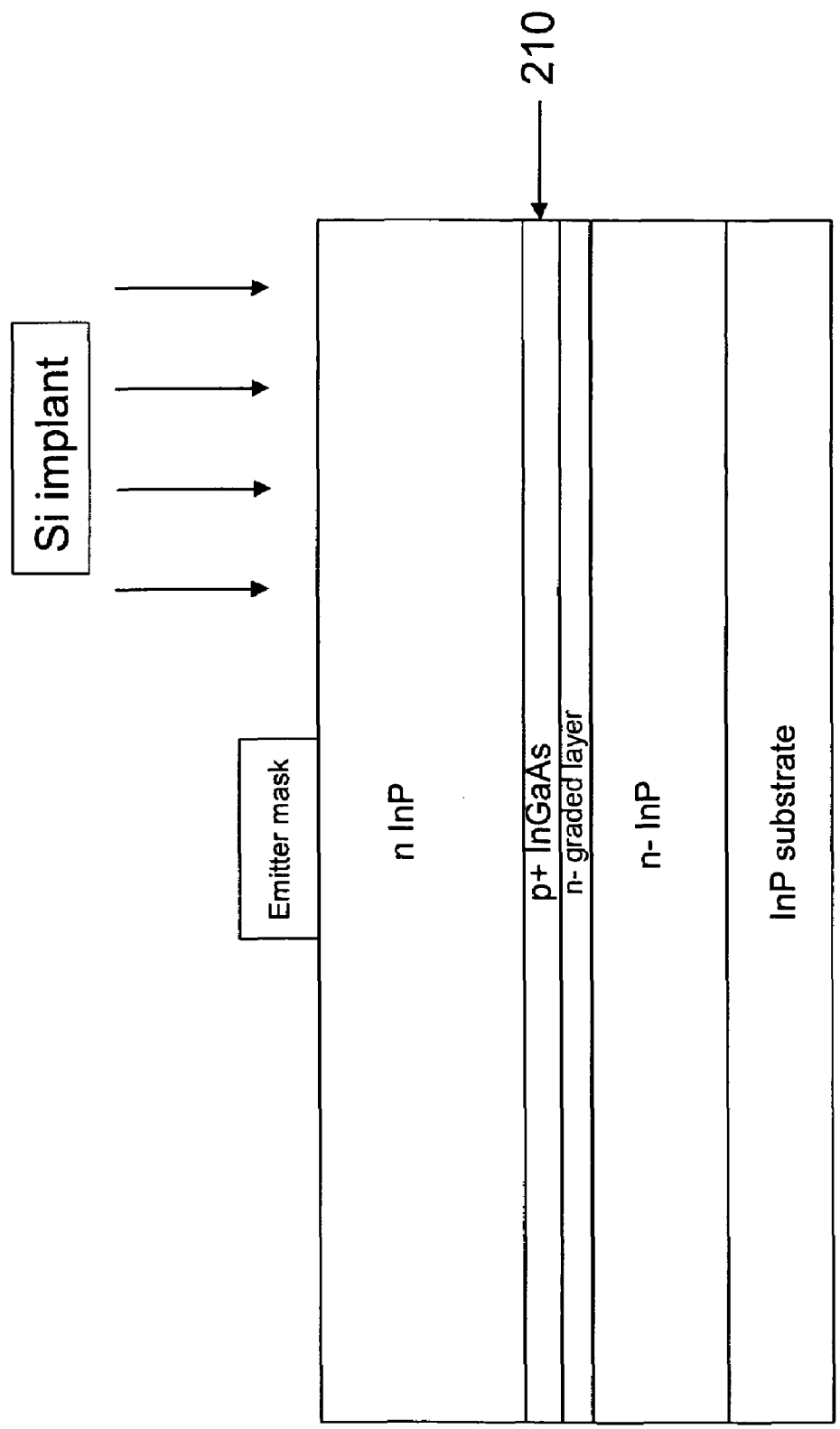
Figure 3C:
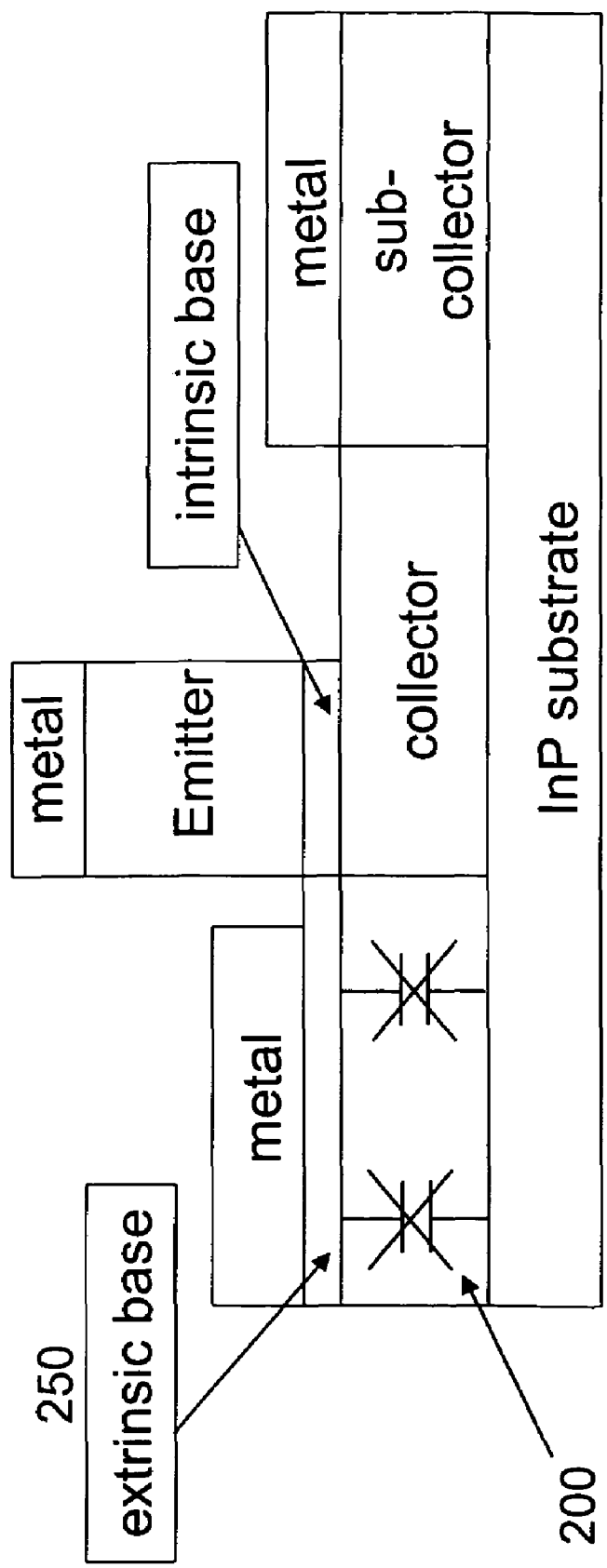

FIGS. 3A, 3B, and 3C illustrate a process flow for fabricating a BJT according to an alternative embodiment of the present invention. FIG. 3A shows epitaxial structures in which the base layer 210 is heavily p+ doped. FIG. 3B shows the structures undergoing the sub-collector implant. FIG. 3C shows the BJT in which collector region 200 under extrinsic base 250 does not contribute significantly to the base-collector capacitance $C_{bc}$ due to the depletion of mobile charge in the collector by the heavier and opposite doping type of base layer 210.

Figure 4A:
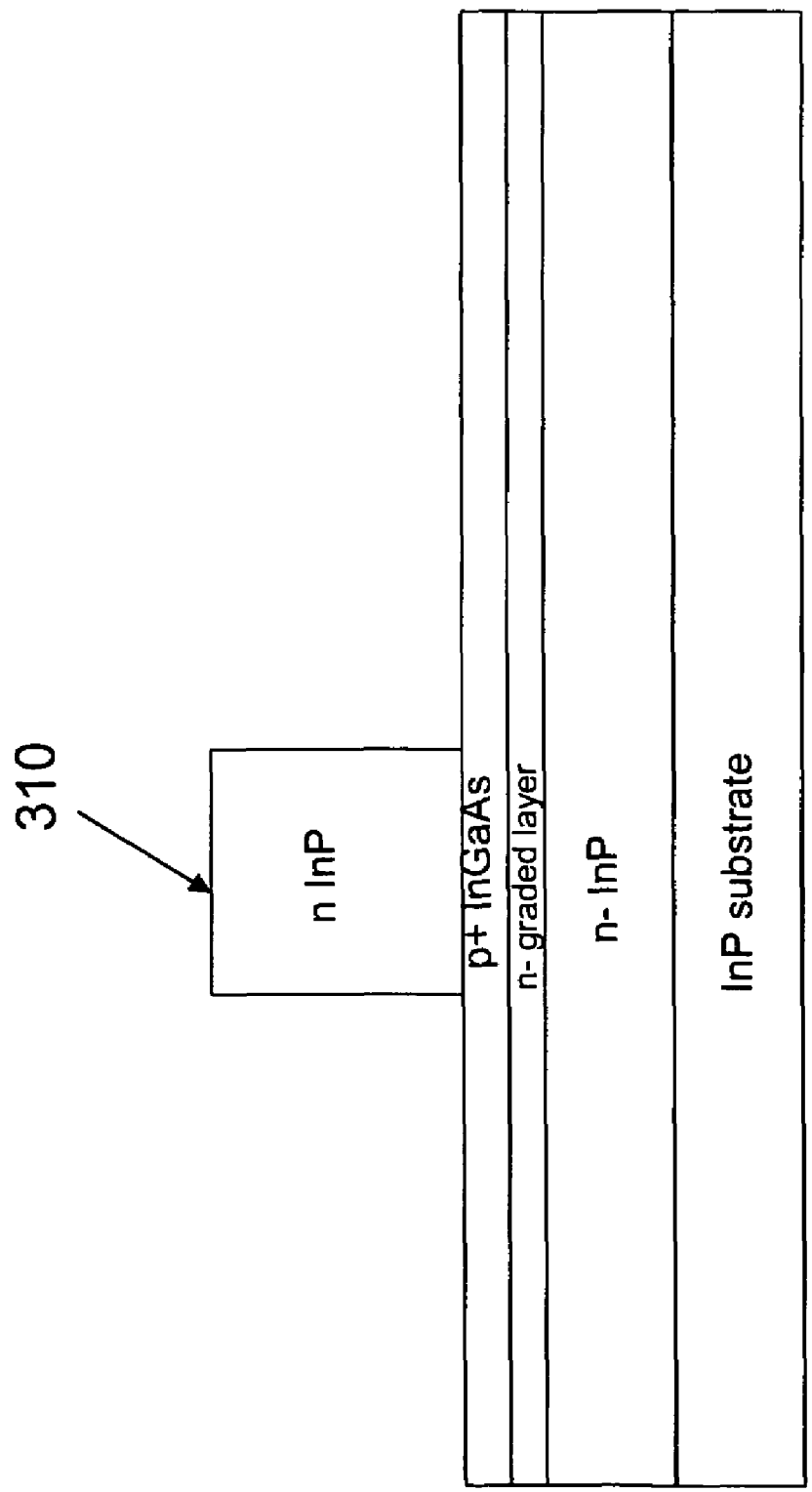
FIGS. 4A, 4B, and 4C are schematic diagrams illustrating a process flow for fabricating a BJT according to another alternative embodiment of the present invention.
Figure 4B:
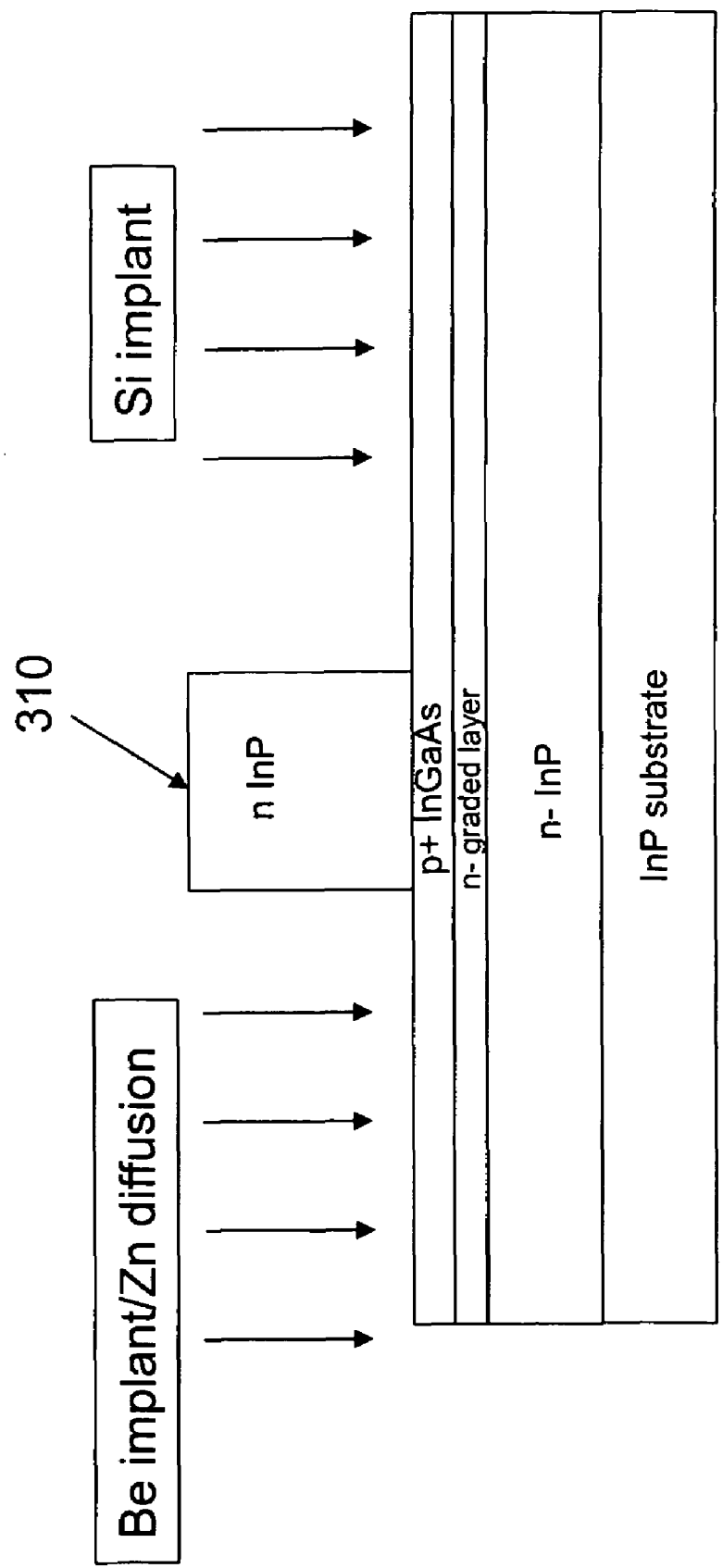
Figure 4C:
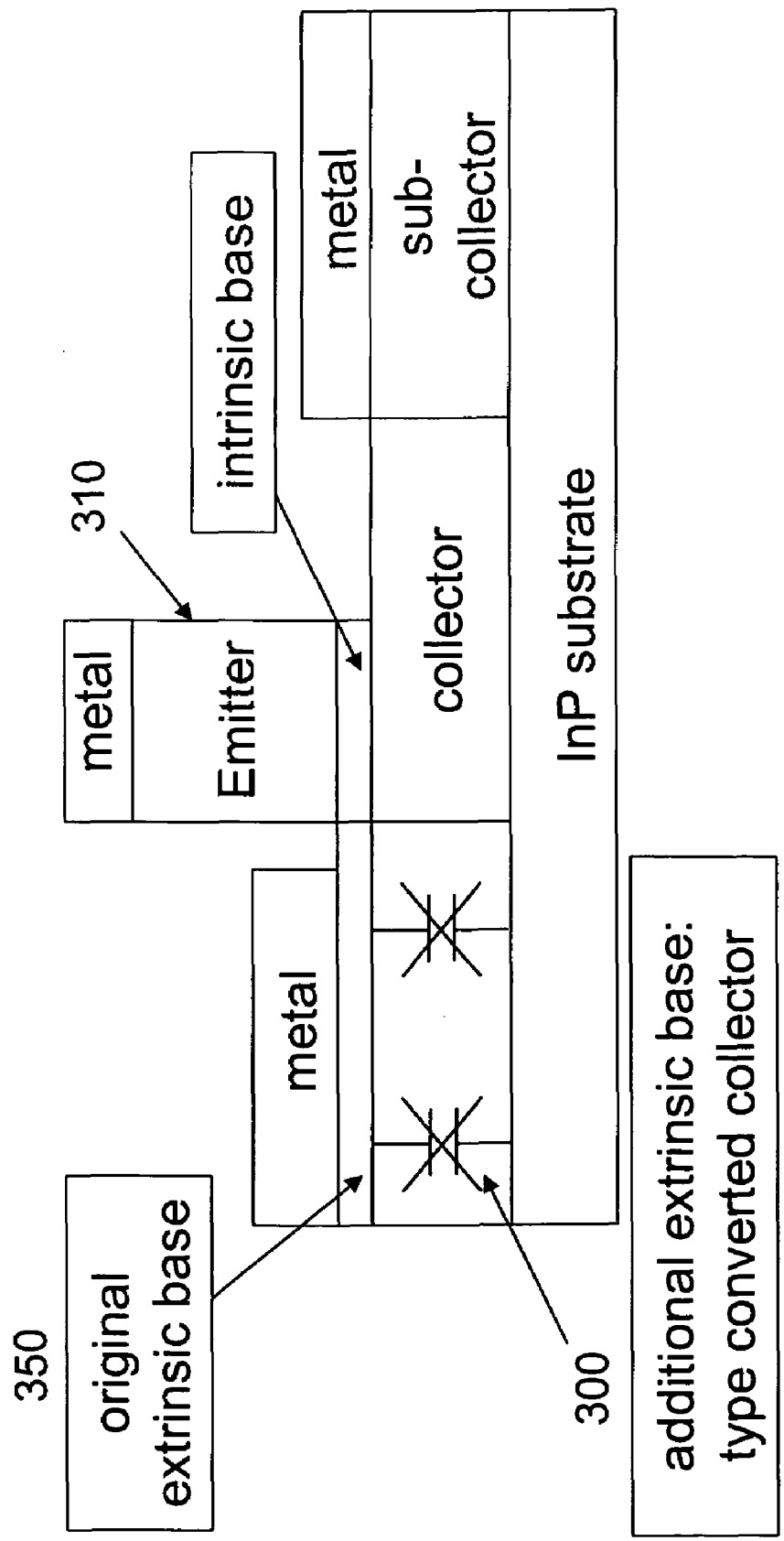

FIGS. 4A, 4B, and 4C illustrate a process flow for fabricating a BJT according to another alternative embodiment of the present invention. FIG. 4A shows epitaxial structure prior to implantation with a defined or etched emitter 310. FIG. 4B shows the structures undergoing the sub-collector and extrinsic base implants. FIG. 4C shows the BJT in which the type converted region 300 under the original extrinsic base 350 does not contribute significantly to the base-collector capacitance $C_{bc}$.

Figure 5A:
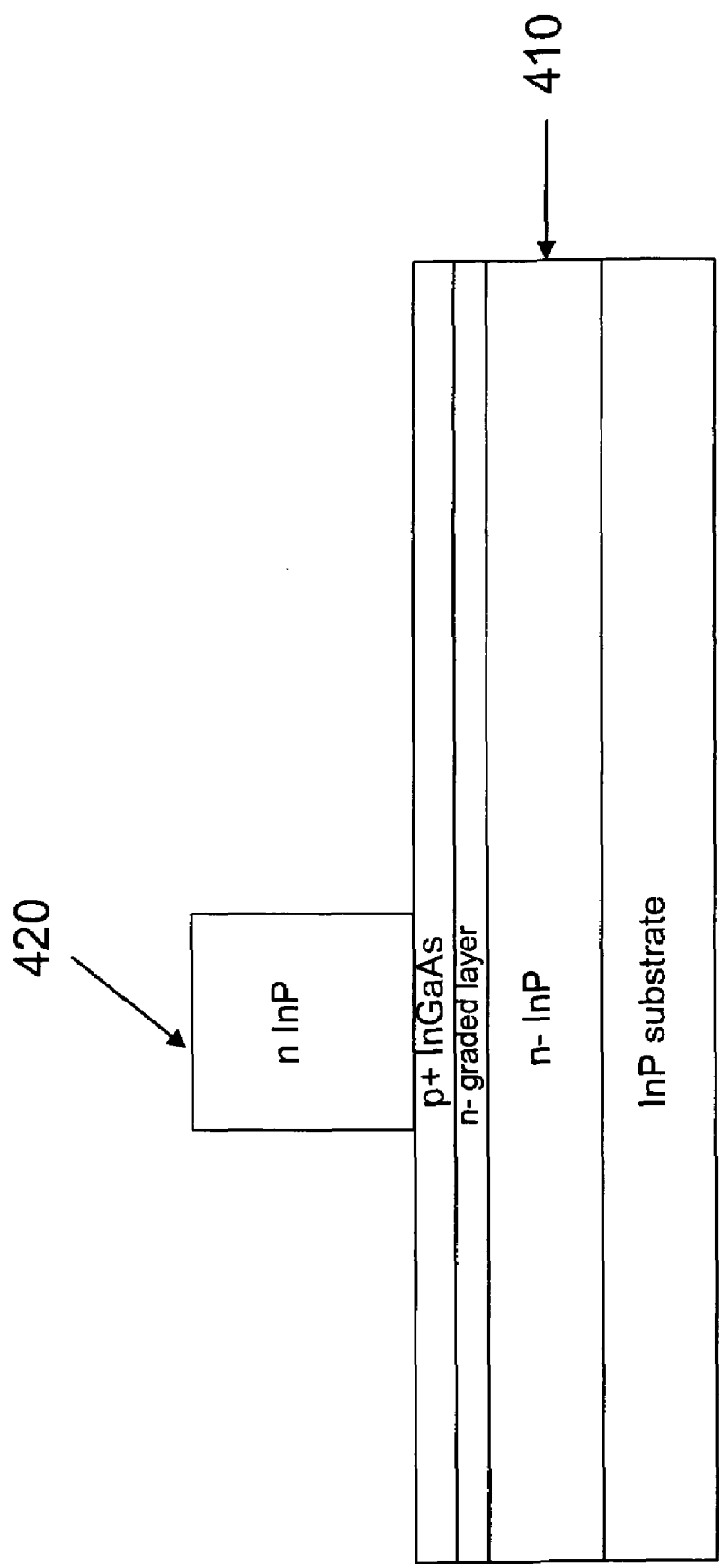
FIGS. 5A, 5B, and 5C are schematic diagrams illustrating a process flow for fabricating a BJT according to yet another alternative embodiment of the present invention.
Figure 5B:
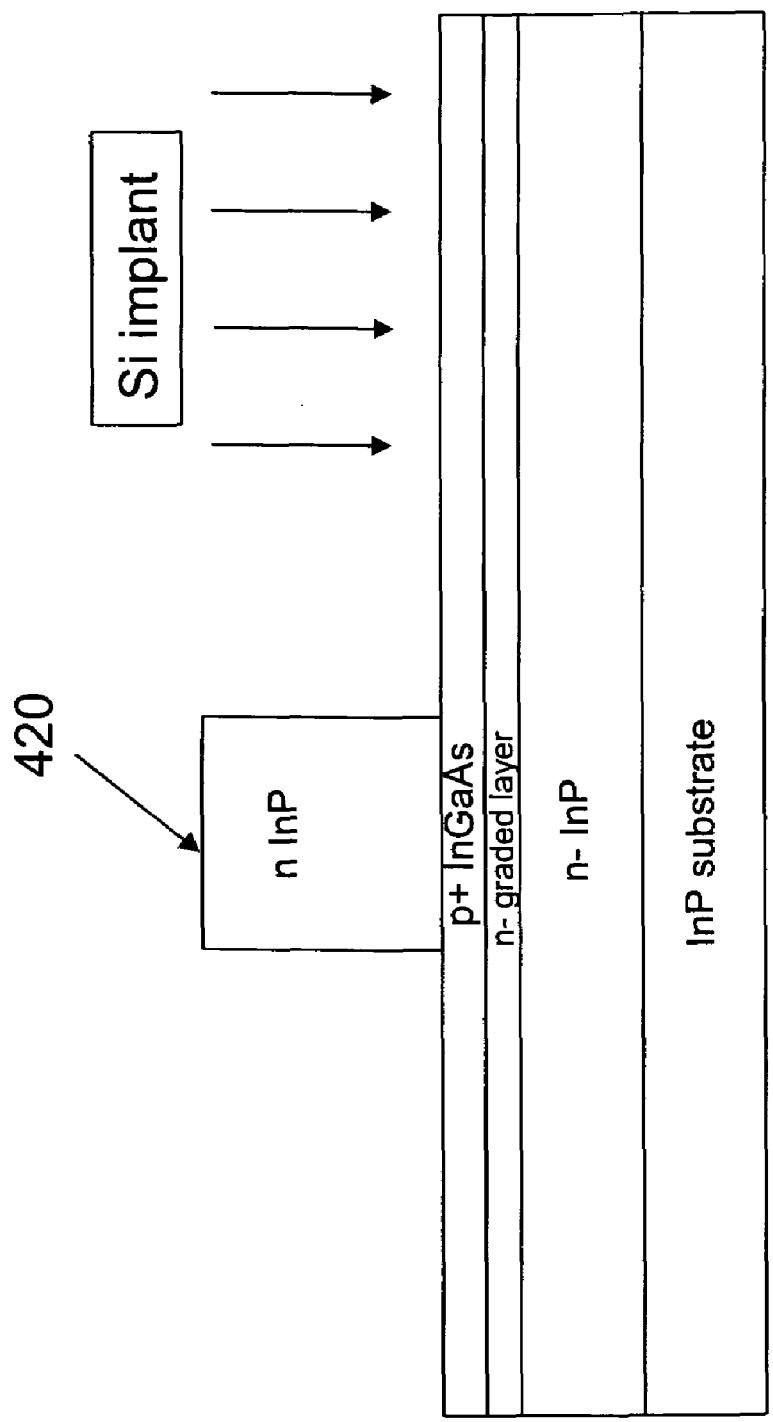
Figure 5C:
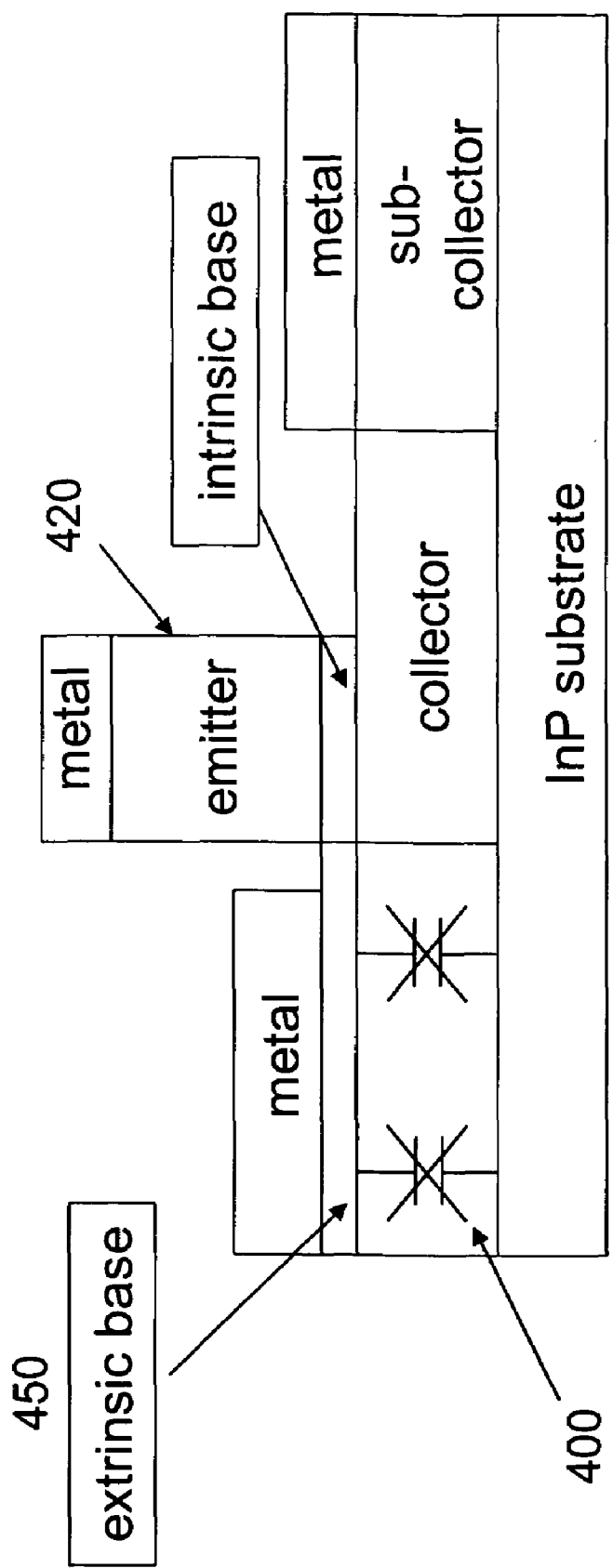

FIGS. 5A, 5B, and 5C illustrate a process flow for fabricating a BJT according to yet another alternative embodiment of the present invention. FIG. 5A shows epitaxial structures in which the base layer 410 is heavily p+ doped and with a defined or etched emitter 420. FIG. 5B shows the structures undergoing the sub-collector implant. FIG. 5C shows the BJT in which collector region 400 under extrinsic base 450 does not contribute significantly the to the base-collector capacitance $C_{bc}$ due to the depletion of mobile charge in the collector by the heavier and opposite doping type of base layer 410.

Figure 6:
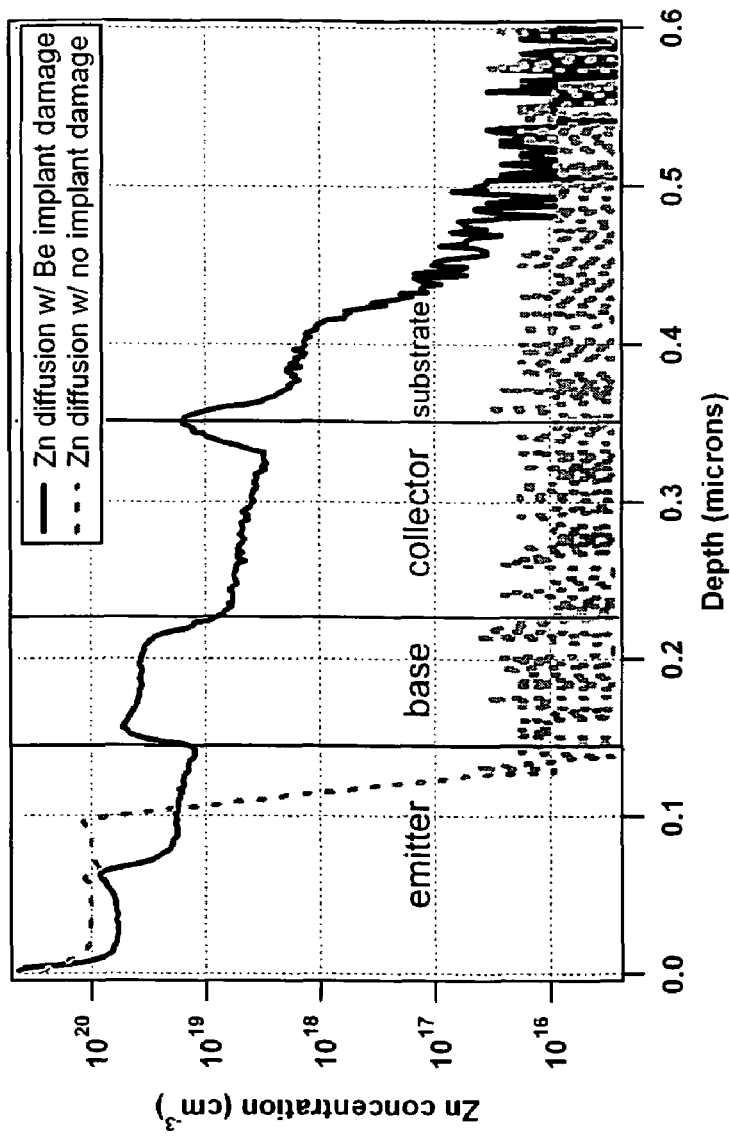
FIG. 6 is a curve (i.e., the solid black curve) illustrating zinc (Zn) diffusion due to damage induced by the implantation of beryllium (Be)

FIG. 6, shows an plot of Zn concentration as a function of depth of a transistor for a doping experiment. Referring to FIG. 6, Zn diffusion (solid black curve) in the presence of damage induced by the implantation of Be is highly effective for doping the extrinsic base, and for the type conversion of the n-type InP collector to p-type. In the absence of damage (dotted grey curve), Zn diffuses only about 0.1 microns. As such, certain embodiments of the present invention enhance dopant diffusion by using implant-damage assisted impurity diffusion to selectively dope the transistors.

In general, an exemplary device architecture of the present invention provides a drastically lower parasitic capacitance and base resistance. Additionally, an exemplary transistor of the present invention is fabricated using ion-implantation, with implant-damage assisted impurity diffusion. As such, embodiments of the present invention provide a drastic departure from layouts and architectures used in traditional bipolar transistors.

In particular, referring now back to FIGS. 2A, 2B, and 2C, the present invention provides a bipolar transistor embodiment that includes a sequence of semiconductor layers having support layer 101, collector layer 102, base layer 103 in contact with the graded collector, layer and emitter layer 104 in contact with base layer 103. Base layer 103 has a doping type that is the opposite of collector layer 102 and emitter layer 104 (or emitter 120). Intrinsic base region 140 contacts emitter 120, and extrinsic base region 150. Extrinsic base region 150 makes contact with base contact metal (or electrode) 160.

More specifically, extrinsic base region 150 extends laterally (or horizontally) from the intrinsic base region 140 that lies directly adjacent to (or vertically below) emitter 120. Electrical contact to the entire base is made though base contact metal (or electrode) 160 contacting extrinsic base 150.

In addition, a substantial portion of sub-collector 110 is located laterally (or horizontally) from collector 130. Sub-collector 110 can be formed with base layer 103 intact or by etching away a part of base layer 103.

Collector region 100 adjacent to (or vertically) below extrinsic base 150 is selectively type-converted to the same doping type as the base to become a portion of extrinsic base 150. That is, extrinsic base 150 includes the type-converted collector region 100. The selective type conversion can be achieved through ion-implantation, dopant diffusion, ion-implant damage assisted dopant diffusion, by opening windows where doping is required and masking other regions where selective doping is not required.

As such, base and access resistance of an BJT embodiment of the present invention is reduced because of the presence of a thick base which includes the type converted collector region 100. In addition, the base contact resistance, can in one embodiment, be further decreased by more heavily doping extrinsic base 150 as compared to that in intrinsic base 140. Moreover, the base-collector capacitance $C_{bc}$ from extrinsic base 150 is significantly (or substantially) less than the base collector capacitance $C_{bc}$ when compared to that of a conventional BJT. The area of extrinsic base 150 can be increased without a significant increase in the base collector capacitance $C_{bc}$.

Alternatively, as shown in FIGS. 5A, 5B, and 5C, collector region 400 adjacent to or below extrinsic base 450 is depleted of charge carriers due to the base doping level being significantly (or substantially) higher and of the opposite type as the collector.

Figure 7:
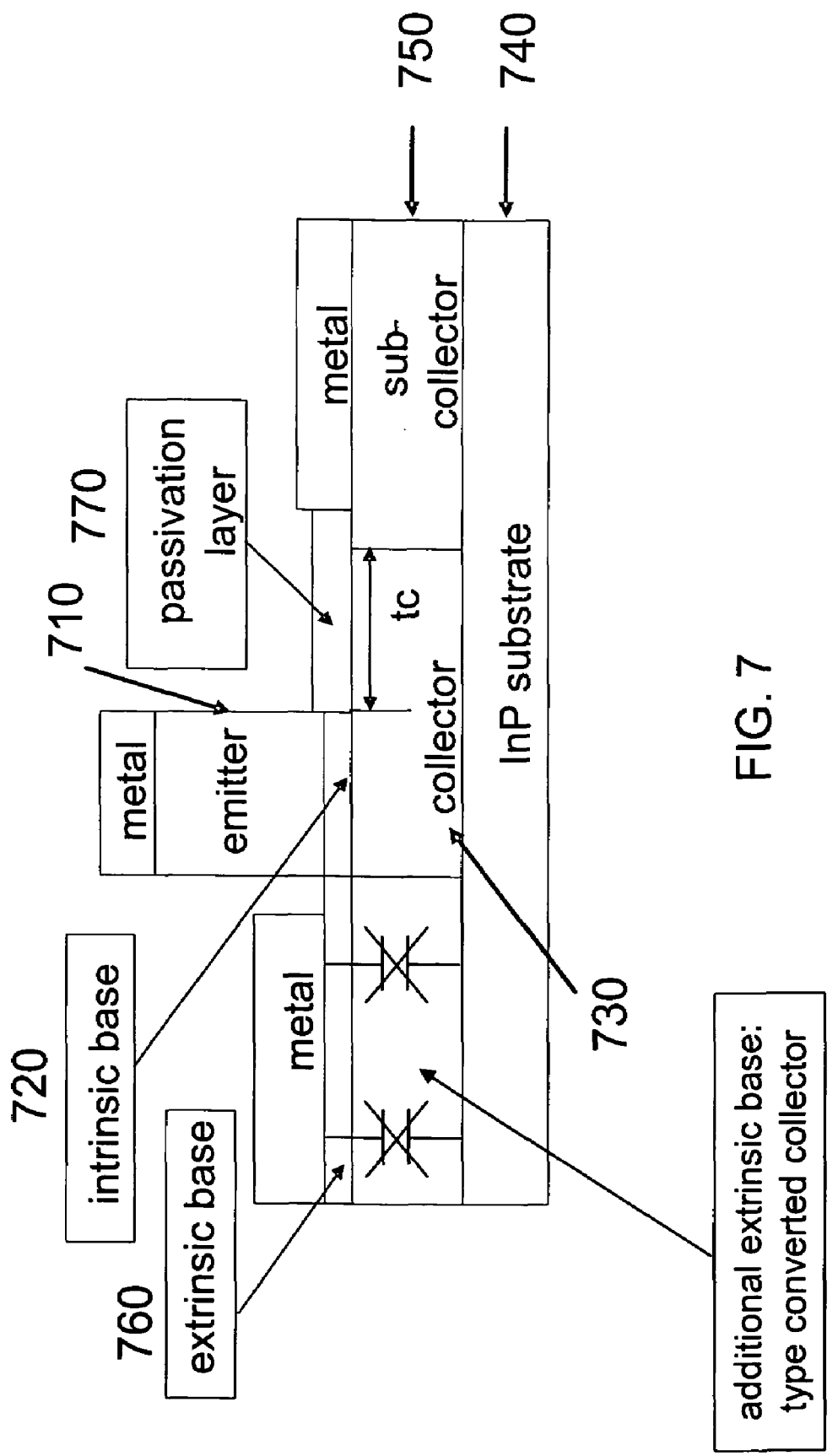
FIG. 7 is a schematic diagram of an exemplary BJT according to the present invention.

Referring to FIG. 7, an exemplary BJT (e.g., DHBT) of the present invention includes a lateral sub-collector 750. Specifically, the exemplary BJT includes emitter 710 that resides on top of intrinsic base 720. The intrinsic base 720 resides on top of collector 730. Collector 730 is formed on top of substrate 740. The substrate 740 can include a buffer layer (not shown). The extrinsic base includes the original extrinsic base 760 and the type converted collector region 765. The sub-collector 750 that is located laterally from the collector 730 is formed by selectively doping a part of the collector. Moreover, passivation layer (or isolation layer) 770 (e.g., an oxide or nitride) is placed on top of collector 730 not covered by intrinsic base 720 to shield or isolate collector 730 from any possible electrical breakdown (i.e., passivation layer 770 is used to protect the collector region between emitter 710 and sub-collector 750). As such, the exemplary BJT of FIG. 7 decouples the area contacting a metal contact of extrinsic base 760 from collector 730 and reduces the base-collector capacitance by minimizing the overlap of extrinsic base 760 with the active collector 730. In addition, the exemplary BJT can improve thermal dissipation of the BJT due to the more planar shape of the BJT, since the collector is directly in contact with the substrate 740. Moreover, integrated circuits may include these exemplary BJTs and other passive components.

In FIG. 7, both extrinsic base 760 and sub-collector 750 are selectively doped and may extend (not shown) to (or partially into) substrate 740. Ion-implantation can be used to realize the selectively doped lateral sub-collector 750. As such, sub-collector 750 is formed by selective doping of the collector and substrate materials. The selective doping of sub-collector 750 can be achieved through ion-implantation, dopant diffusion, or ion-implant damage assisted dopant diffusion.

Ion-implantation can also be used to make extrinsic base 760 that may extend into substrate 740. That is, extrinsic base 760 may include the type converted collector and the type converted substrate 740. The selective type conversion of the extrinsic base 760 can be achieved through ion-implantation, dopant diffusion, and/or ion-implant damage assisted dopant diffusion. The exemplary BJT of FIG. 7 also allows an ability to vary base-collector breakdown voltage $BV_{ceo}$ for transistors located in the same wafer by changing the location of selectively doped sub-collector 750. Specifically, the exemplary BJT of FIG. 7 offers the capability to vary base-collector breakdown voltage, $BV_{ceo}$, for transistors fabricated in the same wafer by changing the distance, tc, of selectively doped sub-collector 750. This offers the ability to optimize transistors located in the same wafer for speed and breakdown voltage, $BV_{ceo}$. The distance, tc, between base 720 and sub-collector 750 can be altered during the lithographic sub-collector definition process to vary the breakdown voltage, $BV_{ceo}$. In more detail, the exemplary BJT of FIG. 7 can be, for example, fabricated using a lithographically defined mask to selectively dope or fabricate sub-collector 750.

Figure 8:
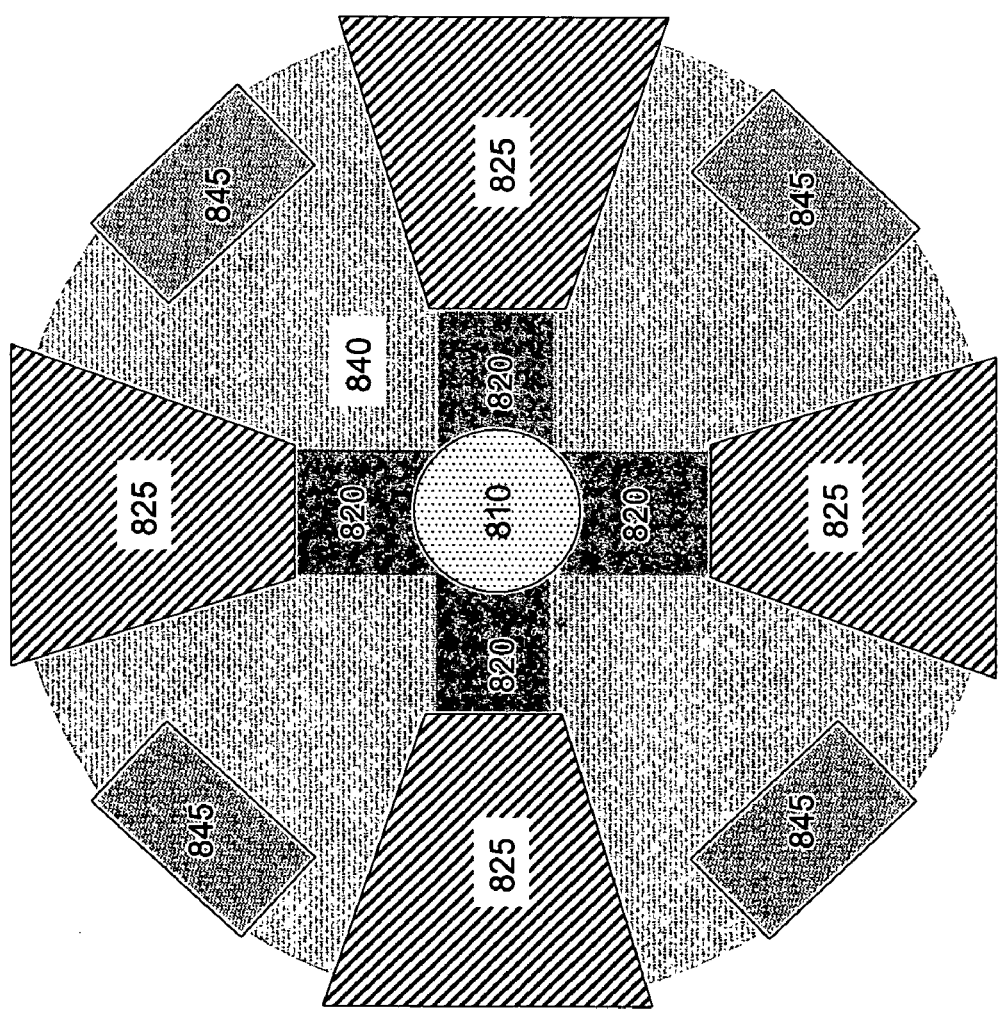
FIG. 8 is a schematic diagram of another exemplary BJT according to the present invention.
Figure 9:
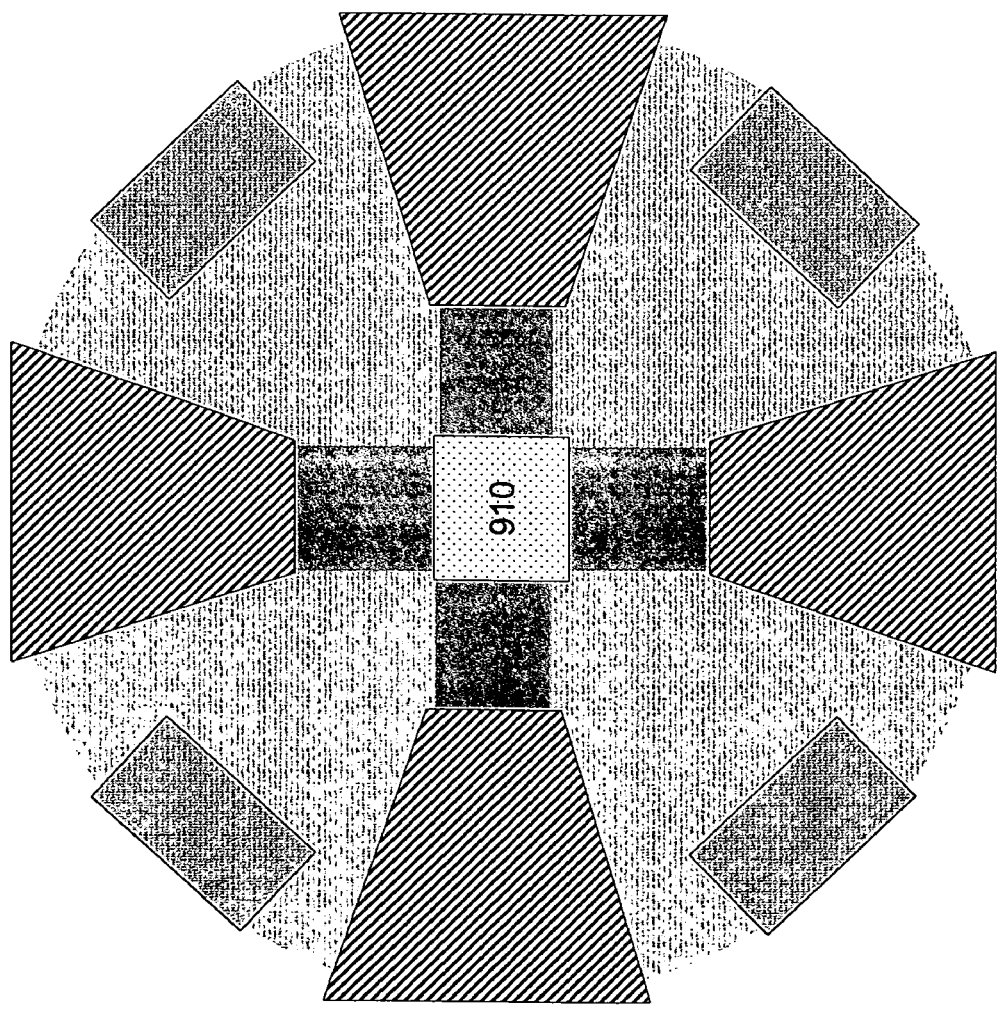
FIG. 9 is a schematic diagram of yet another exemplary BJT according to the present invention.

Referring now to FIG. 8, an exemplary BJT of the present invention includes emitter 810 having a generally circular shape (i.e., emitter 810 has a substantially circular shape). Alternatively, as shown in FIG. 9, an exemplary BJT of the present invention includes emitter 910 having a generally square shape (i.e., emitter 910 has a substantially square shape). Specifically, referring back to FIG. 8, emitter 810 resides in the center of the BJT. In FIG. 8, the exemplary BJT includes an intrinsic base (not shown) directly underneath emitter 810 and extrinsic base 820 that are any other portions of the base other than the intrinsic base. In the exemplary BJT, emitter 810 is surrounded in part by at least a portion of extrinsic base 820 and base contact region 825. In addition, emitter 810 is surrounded in part by collector 840 and sub-collector 845. Here, extrinsic base 820, base contact region 825, and sub-collector 845 each have a plurality of portions that are alternatively arranged to surround emitter 810. In one embodiment, emitter 810 has a dimension (e.g., a diameter or a side) that is less than 150 nm.

In certain exemplary embodiments of the present invention, the collector, the base, and the emitter are made of a material selected from the group consisting of InP, GaAs, GaN, InN, AlN, SiGe, SiC, InGaP, InGaAsP, InGaAs, AlGaAs, InGaAlAs, GaAsSb, InGaAsSb, InGaN, AlGaN, InGaAlN, and SiGeC. The present invention, however, is not limited by these exemplary embodiments.

In view of the foregoing, embodiments of the present invention provide a BJT that decouples the base contact area (area of the base below the base contact metal) from the influence of the collector, resulting in a reduction of $C_{bc}$. Specifically, the present invention provides a transistor embodiment that has a transistor architecture and layout that has no active collector region underneath a base contact area. In addition, the invention provides a method for fabricating a transistor such that, after fabrication, the collector region underneath the base contact area of the transistor is deactivated. As such, embodiments of the invention result in a drastic reduction of the base-collector parasitic capacitance, $C_{bc}$.

In addition, certain transistor embodiments of the present invention use selectively doped sub-collectors and base contact regions and are fabricated such that there is no active collector region underneath a base contact area. This approach offers several advantages as compared to the conventional bipolar transistors. For example, the base contact area is decoupled from the collector. The deactivation of the collector material under the base contact results in a drastic reduction in the base-collector capacitance, $C_{bc}$. The extrinsic base can be doped heavier than the intrinsic base, resulting in reduction of both a base contact resistance and a base access resistance.

While certain exemplary embodiments have been described in detail and shown in the accompanying drawings, it is to be understood that such embodiments are merely illustrative of, and not restrictive of the broad invention. It will thus be recognized that various modifications may be made to the illustrated and other embodiments of the invention described above, without departing from the broad inventive scope thereof. For example, although BJTs (e.g., InP-based DHBTs) and fabrication of the BJTs have been illustrated, it should be apparent that the inventive concepts described above would be equally applicable to other types of BTJs (e.g., SHBTs), transistors and fabrication techniques. In view of the above, it will be understood that the invention is not limited to the particular embodiments or arrangements disclosed, but is rather intended to cover any changes, adaptations or modifications which are within the scope and spirit of the invention as defined by the appended claims and equivalents thereof.

What is claimed is:

1. A bipolar transistor comprising:
   a plurality of semiconductor layers comprising a collector layer, a base layer in contact with the collector layer, and an emitter layer in contact with the base layer, the base layer having the opposite doping type of the collector layer and the emitter layer,
   wherein the plurality of semiconductor layers are formed to comprise:
      an intrinsic base region adjacent to and in contact with the emitter layer and an extrinsic base region, the extrinsic base region being adapted to make contact with a base electrode and extending laterally from the intrinsic base region;
      a sub-collector region connected to a main collector region, located laterally from the main collector region, and adapted to make contact with a collector electrode, the sub-collector region being doped heavier than the collector layer; and
      an emitter formed by the emitter layer,
   wherein a region of the collector layer adjacent to the extrinsic base region is selectively type converted to have the same doping type as the base layer,
   wherein the emitter is surrounded in part by a plurality of portions of the sub-collector region and in part by a plurality of portions of the extrinsic base region, and
   wherein the plurality of portions of the sub-collector region and the plurality of portions of the extrinsic base region are alternatively arranged around the emitter.

2. The bipolar transistor of claim 1, wherein the plurality of semiconductor layers further comprise a support layer in contact with the collector layer, wherein a region of the support layer adjacent to the type converted region of the collector layer is also selectively doped with the same doping type as the base layer, and wherein the support layer comprises a buffer layer.

3. The bipolar transistor of claim 2, wherein the type converted region of the collector layer and the selectively doped region of the support layer become a part of the extrinsic base region.

4. The bipolar transistor of claim 1, wherein the type converted region of the collector layer becomes a part of the extrinsic base region.

5. The bipolar transistor of claim 1, wherein the sub-collector region is formed by selectively doping a portion of the collector layer, and wherein the sub-collector region is substantially located laterally from the intrinsic base region.

6. The bipolar transistor of claim 1, wherein the plurality of semiconductor layers further comprise a support layer in contact with the collector layer, wherein the sub-collector region is formed by selectively doping a portion of the collector layer and a portion of the support layer, wherein the sub-collector region is substantially located laterally from the intrinsic base region, and wherein the support layer comprises a buffer layer.

7. The bipolar transistor of claim 1, wherein the proximity of the sub-collector region to the emitter can be altered to vary with the collector break-down voltage.

8. The bipolar transistor of claim 1, wherein a lateral region of the collector layer between the emitter and the sub-collector region is passivated to improve breakdown characteristics.

9. The bipolar transistor of claim 1, wherein a heterojunction is formed between the emitter layer and the base layer.

10. The bipolar transistor of claim 1, wherein a first heterojunction is formed between the emitter layer and the base layer and a second heterojunction is formed between the base layer and the collector layer.

11. The bipolar transistor of claim 1, wherein the base electrode contacting the extrinsic base region can be increased in area without significantly increasing the base-collector capacitance.

12. The bipolar transistor of claim 1, wherein the extrinsic base region is selectively doped heavier than the intrinsic base region.

13. The bipolar transistor of claim 1, wherein each of the collector layer, the base layer, and the emitter layer is substantially made from a compound comprising two or more elements selected from the group consisting of boron (B), aluminum (Al), gallium (Ga), indium (In), nitrogen (N), phosphorus (P), arsenic (As), antimony (Sb) and bismuth (Bi).

14. The bipolar transistor of claim 1, wherein each of the collector layer, the base layer, and the emitter layer is substantially made from a material comprising one or more elements selected from the group consisting of carbon (C), silicon (Si), and germanium (Ge).

15. The bipolar transistor of claim 1, wherein each of the collector layer, the base layer, and the emitter layer is substantially made from a compound comprising two or more elements selected from the group consisting of beryllium (Be), magnesium (Mg), zinc (Zn), cadmium (Cd), mercury (Hg), manganese (Mn), oxygen (O), sulfur (S), selenium (Se), and tellurium (Te).

16. The bipolar transistor of claim 1, wherein each of the extrinsic base region and the sub-collector region is formed by a masking method and an implant method.

17. The bipolar transistor of claim 1, wherein each of the extrinsic base region and the sub-collector region is formed by a masking method and a diffusion method.

18. The bipolar transistor of claim 1, wherein each of the extrinsic base region and the sub-collector region is formed by a masking method and an implant and diffusion method, wherein the implant and diffusion method comprises an implant method followed by a diffusion method, and wherein the implant method provides damages for enhancing diffusion in a vertical direction.

19. The bipolar transistor of claim 1, wherein the plurality of semiconductor layers are formed to become a planar transistor adapted to improve heat dissipation.

20. The bipolar transistor of claim 1, wherein the plurality of semiconductor layers are formed to become an active component in an integrated circuit.

21. The bipolar transistor of claim 1, wherein the emitter layer substantially comprises InP or InAlAs, the base layer substantially comprises InGaAs or GaAsSb, and the collector layer substantially comprises InGaAs or InP.

22. The bipolar transistor of claim 1, wherein the sub-collector region is implanted with silicon (Si).

23. The bipolar transistor of claim 1, wherein the extrinsic base region is doped with zinc (Zn), beryllium (Be), or both Zn and Be.

24. The bipolar transistor of claim 1, wherein the sub-collector region is implanted with silicon (Si), and wherein the extrinsic base region is doped with zinc (Zn) and beryllium (Be).

25. The bipolar transistor of claim 1, wherein the extrinsic base region and the sub-collector region are formed with the emitter layer intact.

26. The bipolar transistor of claim 1, wherein the extrinsic base region and the sub-collector region are formed by etching away a part of the emitter layer.

27. The bipolar transistor of claim 1, wherein the sub-collector region is formed with the base layer intact.

28. The bipolar transistor of claim 1, wherein the sub-collector region is formed by etching away a part of the base layer.

29. The bipolar transistor of claim 1, wherein the emitter has a substantially circular shape.

30. The bipolar transistor of claim 1, wherein a dimension of the emitter is less than 150 nm.

31. The bipolar transistor of claim 1, wherein the emitter layer, the base layer, and the collector layer can be graded in composition and can include multiple layers of materials.

32. A bipolar transistor comprising:
a plurality of semiconductor layers comprising a collector layer, a base layer in contact with the collector layer, a support layer in contact with the collector layer, and an emitter layer in contact with the base layer, the base layer having the opposite doping type of the collector layer and the emitter layer,
wherein the plurality of semiconductor layers are formed to comprise:
an intrinsic base region adjacent to and in contact with the emitter layer and an extrinsic base region, the extrinsic base region being adapted to make contact with a base electrode and extending laterally from the intrinsic base region;
a sub-collector region connected to a main collector region, located laterally from the main collector region and not interposed between the main collector region and the support layer to reduce a parasitic capacitance of the bipolar transistor, and adapted to make contact with a collector electrode, the sub-collector region being doped heavier than the collector layer; and
an emitter formed by the emitter layer,
wherein a region of the collector layer adjacent to the extrinsic base region is selectively type converted to have the same doping type as the base layers
wherein the emitter is surrounded in part by a plurality of portions of the sub-collector region and in part by a plurality of portions of the extrinsic base region,
wherein the plurality of portions of the sub-collector region and the plurality of portions of the extrinsic base region are alternatively arranged around the emitter, and wherein a region of the support layer adjacent to the type converted region of the collector layer is also selectively doped with the same doping type as the base layer.

33. A bipolar transistor comprising:
a plurality of semiconductor layers comprising a collector layer, a base layer in contact with the collector layer, a support layer in contact with the collector layer, and an emitter layer in contact with the base layer, the base layer having the opposite doping type of the collector layer and the emitter layer,
wherein the plurality of semiconductor layers are formed to comprise:
   an intrinsic base region adjacent to and in contact with the emitter layer and an extrinsic base region, the extrinsic base region being adapted to make contact with a base electrode and extending laterally from the intrinsic base region;
   a sub-collector region connected to a main collector region, located laterally from the main collector region, and adapted to make contact with a collector electrode, the sub-collector region being doped heavier than the collector layer; and
   an emitter formed by the emitter layer,
wherein a region of the collector layer adjacent to the extrinsic base region is selectively type converted to have the same doping type as the base layer,
wherein the sub-collector region is not interposed between the extrinsic base region and the support layer,
wherein the sub-collector region is also not interposed between the intrinsic base region and the support layer,
wherein the emitter is surrounded in part by a plurality of portions of the sub-collector region and in part by a plurality of portions of the extrinsic base region,
wherein the plurality of portions of the sub-collector region and the plurality of portions of the extrinsic base region are alternatively arranged around the emitter, and
wherein a region of the support layer adjacent to the type converted region of the collector layer is also selectively doped with the same doping type as the base layer.

\* \* \* \* \*